(12) United States Patent
Hernandez-Marti

(10) Patent No.: US 6,509,755 B2
(45) Date of Patent: Jan. 21, 2003

(54) METHOD AND DEVICE FOR ACTIVE IMPEDANCE MATCHING

(75) Inventor: Ramon Hernandez-Marti, Austin, TX (US)

(73) Assignee: Schlumberger Technology Corporation, Austin, TX (US)

( * ) Notice: Subject to any disclaimer, the term of this patent is extended or adjusted under 35 U.S.C. 154(b) by 0 days.

(21) Appl. No.: 09/790,257

(22) Filed: Feb. 21, 2001

(65) Prior Publication Data

US 2001/0045843 A1 Nov. 29, 2001

Related U.S. Application Data

(60) Provisional application No. 60/185,656, filed on Feb. 29, 2000.

(51) Int. Cl.[7] .............................................. H03K 17/16
(52) U.S. Cl. ........................................... 326/30; 326/82
(58) Field of Search ...................... 326/30, 82; 333/32; 328/164; 455/241.1; 375/258

(56) References Cited

U.S. PATENT DOCUMENTS 4,090,154 A * 5/1978 Hauchart ..................... 333/32
4,359,609 A 11/1982 Apfel
6,341,135 B1 * 1/2002 Fawal et al. ................. 370/419

* cited by examiner

Primary Examiner—Daniel D. Chang
(74) Attorney, Agent, or Firm—Pehr B. Jannson; William B. Batzer; John J. Ryberg

(57) ABSTRACT

Dynamic matching of a source impedance to a load impedance or the complex conjugate of the load impedance. An embodiment of the invention is a device for active impedance matching comprising a voltage driver having an output connected to a load, means for detecting an output current from the voltage driver to the load, means for scaling the detected output current by a scaling value, and means for subtracting a value representing the scaled detected output current from an input signal of the voltage driver. Another embodiment is a device for active impedance matching comprising a current driver having an output connected to a load, means for detecting an output voltage from the current driver to the load, means for scaling the detected output voltage by a scaling value, and means for subtracting a value representing the scaled detected output voltage from an input signal of the current driver.

16 Claims, 7 Drawing Sheets

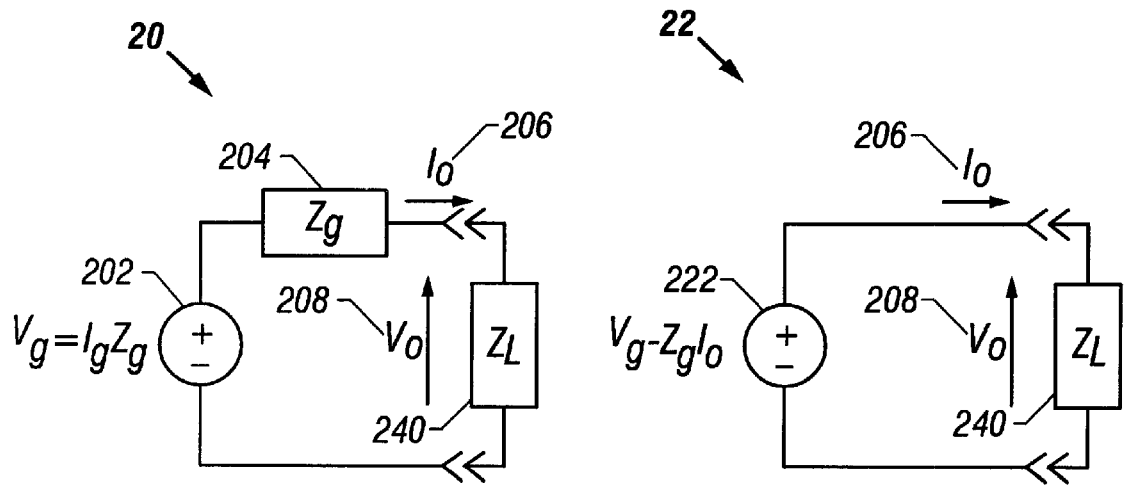
FIG. 2A
*(Prior Art)*
FIG. 2B
*(Prior Art)*
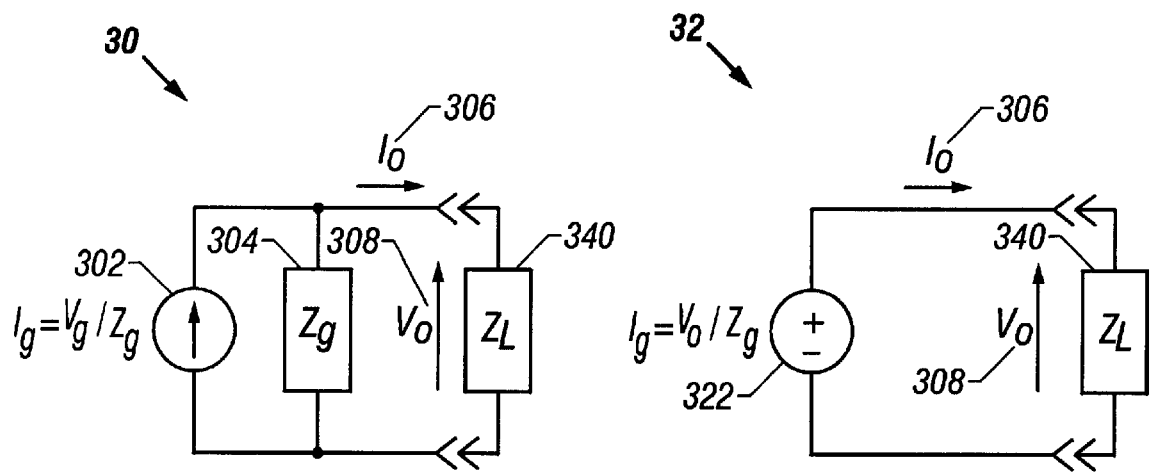
FIG. 3A
*(Prior Art)*
FIG. 3B
*(Prior Art)*

METHOD AND DEVICE FOR ACTIVE IMPEDANCE MATCHING

This application claims the benefit of U.S. Provisional Application No. 60/185,656, filed on Feb. 29, 2000.

BACKGROUND

The invention relates generally to transmission lines and, more particularly, to adjusting the terminating and driving impedance of a transmission line to match the characteristic impedance of the transmission line.

It is well known to skilled practitioners in the electrical arts that if a source impedance is matched to a complex conjugate of a load impedance, maximum power transfer between the source and the load is achieved. However, it is difficult to match the imaginary part of the complex impedance and half of the power is lost in the matched source impedance when using passive components for impedance matching. Although this is a characteristic of many electrical circuits, it may take on greater significance where transmission lines are considered. With transmission lines, the primary objective is to avoid reflections in the transmission line, so the characteristic impedance is assumed to be resistive.

Transmission lines, where the transmission line length is large with respect to the wavelength of the lowest transmission frequency, are commonly used for transmission of data between two or more locations. It is well known in the art of transmission lines, and particularly transmission lines for transmitting information at high data rates, that in order to maximize the efficiency of information transfer with minimum loss and dispersion effects, the terminating impedance of a receiver and the driving impedance of a transmitter must match the characteristic impedance $Z_0$ of the transmission line over the frequency range of interest. That is, it is desirable to maintain a uniform characteristic impedance $Z_0$ along the length of the signal carrying line. Any mismatch in the characteristic impedance across interconnect interfaces will cause reflection of the signal at the interface, resulting in losses and distortion of the signal in the form of attenuation, echo and cross-talk. Furthermore, multiple reflections from multiple interfaces only compound the deleterious affect on the information-carrying signal. The classical solution to the impedance matching problem involves attempting to match the distributed-parameter impedance of the transmission line with lumped-parameter impedances of resistor, capacitor and inductor circuit elements.

Wide band communication channels, like ADSL modulation over telephone conventional lines or other wideband modulation schemes, require matching of line impedances that are complex, where amplitude and phase are dependent on frequency. Telephone subscriber loops with bridged taps present impedance variations at the receiver end that are difficult to match using simple circuits. Furthermore, the impedances variations may change from loop to loop, making it impossible to design a matching circuit using generic discrete circuit components. The use of full-duplex techniques, where bi-directional transmission is conducted concurrently only further complicates the difficulty of matching interface impedances to the characteristic impedance of the transmission line.

There have been a number of different approaches to solving the characteristic impedance matching problem. In the most simple and rudimentary form, fixed resistor elements are connected across the transmission line interfaces to match the interface impedance with the characteristic impedance of the transmission line. More complex impedance matching circuits using combinations of resistor and capacitor elements are often found connected to transmission lines. Impedance matching circuits using passive components may dissipate half of the available power at the transmitter, oftentimes reducing its dynamic range by half. Although power is seldom a major consideration on a standard data transmission line, loss in dynamic range can result in excessive signal clipping with high peak to average ratios that are typical of Quadrature Amplitude Modulated signals and Discrete Multi-Tone signals, used in many modern data transmission systems.

One of the oldest and widely used approaches to match a transmitter-receiver to a transmission line is a hybrid circuit that makes use of two transformers and a balance impedance network $Z_L$ that, when matched to the characteristic impedance $Z_0$ of the transmission line, results in very high isolation between transmitter and receiver circuits. This circuit provides a line termination that matches the characteristic impedance of the line and results in no reduction in dynamic range. However, only half the power delivered by the transmitter is sent to the transmission line, the other half being wasted on the balancing impedance network $Z_L$. In addition to loss of transmitted power, the balancing impedance network $Z_L$ cannot perfectly match a line with bridged taps or multiple interfaces. It is impractical to add switching circuits to adapt the impedance to different lines, where each line has a different configuration of taps or interfaces along the length of the line. Furthermore, this hybrid circuit makes use of multiple magnetic circuits that have inherent non-linear characteristics that produce distortion, which adversely affects signals with high peak to average ratios. These transformers also exhibit parasitic capacitance and leakage inductance that may impair circuit operation and reduce useful bandwidth.

Another approach that has received increased interest is the use of a differential driver circuit having two outputs, where each output is connected through an impedance matching resistor to each of the two terminals, respectively, of the primary winding of a transformer. The secondary winding of the transformer is connected to the transmission line. However, not only is half of the transmitter power dissipated in the two impedance matching resistors, but half of the signal amplitude is also dropped across these resistors. This results in reducing the dynamic range of the signal at the transmitter by one-half and reducing the maximum power available to drive the transmission line by one-fourth. The transformer provides for scaling the line impedance to compensate for this reduction and for generating enough peak voltage without excessive clipping. Two amplifiers, each connected across a terminating resistor receive the signal on the transmission line. This circuit may only perform better than the hybrid circuit described above in the high frequency range, where the line impedance will be mostly resistive in nature. Although more complex networks may replace these terminating resistors, the resultant configuration would also suffer from the same limitations as the hybrid circuit described above, namely low power efficiency and reduced dynamic range.

All of these solutions assume that the characteristic impedance of the transmission line is fixed and known, and therefore terminated accordingly. These solutions result in reduced power available to the transmission line, reduced dynamic range of the signal, and losses and distortion in the signal. Although more pronounced with transmission lines, these problems apply to many electrical circuits.

For the foregoing reasons, it is desirable to have a method and device for driving and receiving signals on a transmission line that does not exhibit loss of the available transmitter power to drive the line, does not suffer from a reduction in dynamic signal range, and dynamically matches the driving and terminating impedance at the interfaces to the characteristic impedance of the transmission line.

SUMMARY

The present invention is directed to a method and device for driving a load with active impedance matching that satisfies these needs. The present invention is particularly suitable for providing a method and device for driving and receiving signals on a transmission line that does not exhibit loss of the available transmitter power to drive the line, does not suffer from a reduction in dynamic signal range, and dynamically matches the transmission line interface driving and terminating impedance to the characteristic impedance of the transmission line.

In a voltage driver version of the present invention, a means is provided for sensing the current provided to a load by a voltage source, and the magnitude of the voltage source is automatically adjusted by negatively feeding back a voltage to an input that represents a scaled value of the sensed current multiplied by an impedance that matches the load impedance. The result is a voltage source having an effective internal impedance that matches the load impedance, but yet maintains full dynamic signal range without a loss of transmitted power to the load.

In a current driver version of the present invention, a means is provided for sensing the voltage provided to a load by a current source, and the magnitude of the current source is automatically adjusted by negatively feeding back a current to an input that represents a scaled value of the sensed voltage divided by an impedance that matches the load impedance. The result is a current source having an effective internal impedance that matches the load impedance, but yet maintains full dynamic signal range without a loss of transmitted power to the load.

Although the present method and device is applicable to many electrical circuits, its application is particularly suitable to transmission lines.

A device having features of the present invention is a device with active impedance matching for driving a load that comprises a voltage driver having an output connected to a load, means for detecting an output current from the voltage driver to the load, means for scaling the detected output current by a scaling value, and means for subtracting a value representing the scaled detected output current from an input signal of the voltage driver. The means for scaling the detected output current may be a multiplier having an input comprising the detected output current and another input comprising the scaling value, an output of the multiplier representing the scaled output current. The device of claim 2, wherein the scaling value is a value representing a load impedance to be matched. The means for scaling the detected output current may be an amplifier having an input comprising the detected output current and a gain equal to the scaling value, an output of the amplifier representing the scaled output current. The means for detecting an output current may be a transformer having a primary winding in series with the output current. The means for detecting an output current may be a resistor in series with the output current and an amplifier with inputs connected to terminals of the resistor. The means for subtracting may be a summing junction of an operational amplifier. The load may be a transmission line. The scaling value may be a characteristic impedance of the transmission line. The means for scaling and the means for subtracting may comprise a digital signal processor.

In an alternative embodiment of the present invention, a device with active impedance matching for driving a load comprises a current driver having an output connected to a load, means for detecting an output voltage from the current driver to the load, means for scaling the detected output voltage by a scaling value, and means for subtracting a value representing the scaled detected output voltage from an input signal of the current driver. The means for scaling the detected output voltage may be a multiplier having an input comprising the detected output voltage and another input comprising the scaling value, an output of the multiplier representing the scaled output voltage. The scaling value may be a value representing a load impedance to be matched. The means for scaling the detected output voltage may be an amplifier having an input comprising the detected output voltage and a gain equal to the scaling value, an output of the amplifier representing the scaled output voltage. The means for detecting an output voltage may be an amplifier with inputs connected to the outputs of the current driver. The means for detecting an output voltage may be a transformer with primary terminals connected to the outputs of the current driver. The means for subtracting may be a summing junction of an operational amplifier. The load may be a transmission line. The scaling value may be a characteristic impedance of the transmission line. The means for scaling and the means for subtracting may comprise a digital signal processor.

In another alternative embodiment of the present invention, a method for driving a load with active impedance matching, comprises connecting an output of a voltage driver to a load, detecting an output current from the voltage driver to the load, scaling the detected output current by a scaling value, and subtracting a value representing the scaled detected output current from an input signal of the voltage driver. Scaling the detected output current may comprise multiplying the detected output current by the scaling value, an output of the multiplication representing the scaled output current. The scaling value may be a value representing a load impedance to be matched. The detected output current may comprise amplifying the detected output current by the scaling value for obtaining a value representing the scaled output current. Detecting an output current may comprise connecting a primary winding of a transformer in series with the output current. Detecting an output current may comprise connecting a resistor in series with the output current and connecting inputs of an amplifier to terminals of the resistor. Subtracting may comprise summing currents into a summing junction of an operational amplifier. The load may be a transmission line. The scaling value may be a characteristic impedance of the transmission line. Scaling and subtracting may comprise processing instructions of a digital signal processor.

In another alternative embodiment of the present invention, a method for driving a load with active impedance matching comprises connecting an output of a current driver to a load, detecting an output voltage from the current driver to the load, scaling the detected output voltage by a scaling value, and subtracting a value representing the scaled detected output voltage from an input signal of the current driver. Scaling the detected output voltage may comprise multiplying the detected output voltage by the scaling value, an output of the multiplication representing the scaled output voltage. The scaling value may be a value representing a load impedance to be matched. Scaling the detected output voltage may comprise amplifying the detected output voltage by the scaling value for obtaining a value representing the scaled output voltage. Detecting an output voltage may comprise connecting inputs of an amplifier to outputs of the current driver. Detecting an output voltage may comprise connecting a primary winding of a transformer to the outputs of the current driver. Subtracting may comprise summing currents into a summing junction of an operational amplifier. The load may be a transmission line. The scaling value may be a characteristic impedance of the transmission line. Scaling and subtracting may comprise processing instructions of a digital signal processor.

In another alternative embodiment of the present invention, a method for driving a load with active impedance matching comprises connecting an output of a voltage driver to a load, detecting an output current value from the voltage driver to the load, connecting the detected output current to an analog-to-digital converter, converting the detected output current value to a digital representation by the analog-to-digital converter, connecting the digital representation of the output current at an output of the analog-to-digital converter to an input of a digital signal processor, connecting a digital representation of an input signal to another input of the digital signal processor, executing a program in the digital signal processor, providing an digital representation output from the digital signal processor to a digital-to-analog converter, and connecting an output of the digital-to-analog converter to an input of the voltage driver. The method may further comprise interposing an anti-aliasing low-pass filter between the detected current output and the analog-to-digital converter. The method may further comprise interposing an interpolation low-pass filter between the output of the digital-to-analog converter and the input of the voltage driver. The step of connecting a digital representation of an input signal may comprise connecting an input signal to another input of the voltage driver. The step of executing a program in the digital signal processor may further comprise executing an initialization routine, reading an input voltage value, associating a time value with the input voltage value, adjusting the time value with a time domain filter delay, reading an output current value from the analog-to-digital converter, applying the output current value to the time domain filter, subtracting the filtered output current value from the adjusted input voltage value, outputting the result of the subtraction to a digital-to-analog converter, repeating steps b. through h. if the program is not terminated, and ending the process if the program is terminated.

BRIEF DESCRIPTION OF THE DRAWINGS

These and other features, aspects, and advantages of the present invention will become understood with regard to the following description, appended claims, and accompanying drawings where:

FIG. 2A shows a Thevenin equivalent of a voltage transmitter circuit;

FIG. 2B shows an equivalent circuit of the circuit shown in FIG. 2A;

FIG. 3A shows a Norton equivalent of a current transmitter circuit;

FIG. 3B shows an equivalent circuit of the circuit shown in FIG. 3A;

DETAILED DESCRIPTION

Figure 1A:
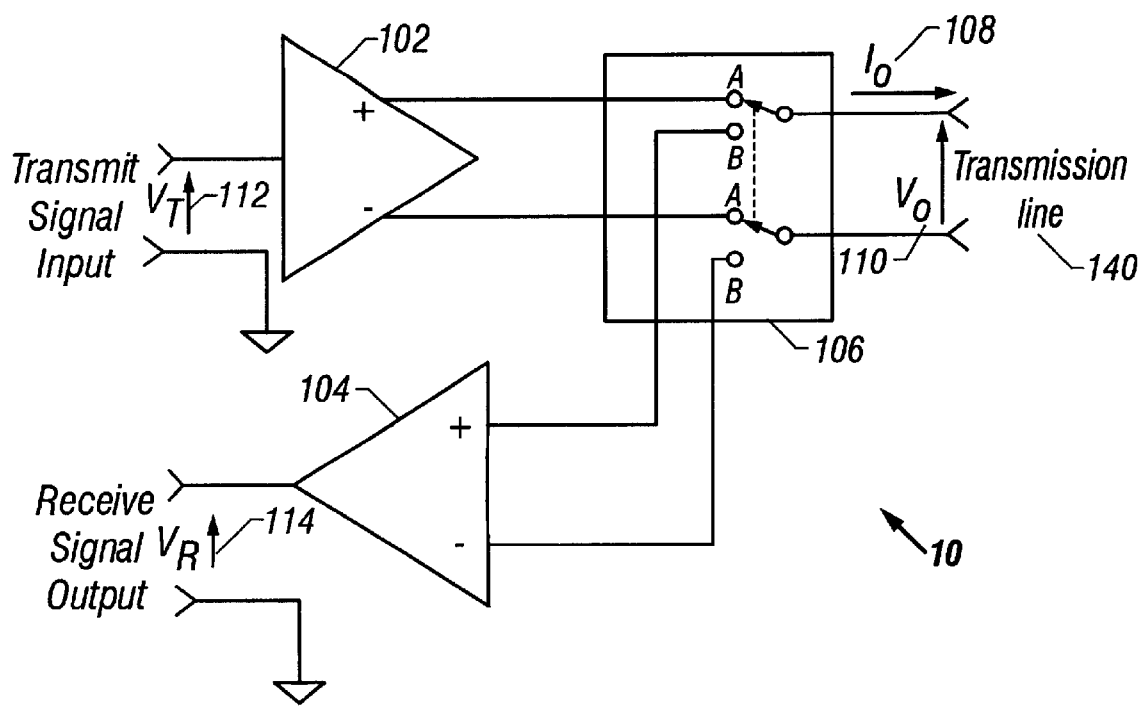
FIG. 1A shows a half duplex configuration of a transmitter/receiver circuit.

Turning now to FIG. 1A, FIG. 1A shows a half duplex configuration 10 of transmitter/receiver circuit connected to a transmission line 140. This configuration is well known to skilled practitioners in the relevant art. In the half duplex configuration of FIG. 1A, a transmit input signal 112 is connected to an input of a differential transmitter 102. An output of the transmitter is connected to a switch 106. A receive output signal 114 is provided by an output of a differential receiver 104. An input of the receiver 104 is connected to the switch 106. A transmission line signal 108, 110 is connected to the switch 106 such that the when the switch 106 is in position A, the transmission line signal 108, 110 is connected to the output of the transmitter 102, for transmitting a transmission line signal 108, 110. Alternatively, when the switch is in position B, the transmission line signal 108, 110 is connected to the input of the receiver 104, for receiving a transmission line signal 108, 110. Although the switch 106 is depicted as an electromechanical device, skilled practitioners would recognize that a semiconductor device would normally provide this function for half duplex operation. In half duplex operation, a transmission line 140 is transmitting signals in one direction at a time.

Figure 1B:
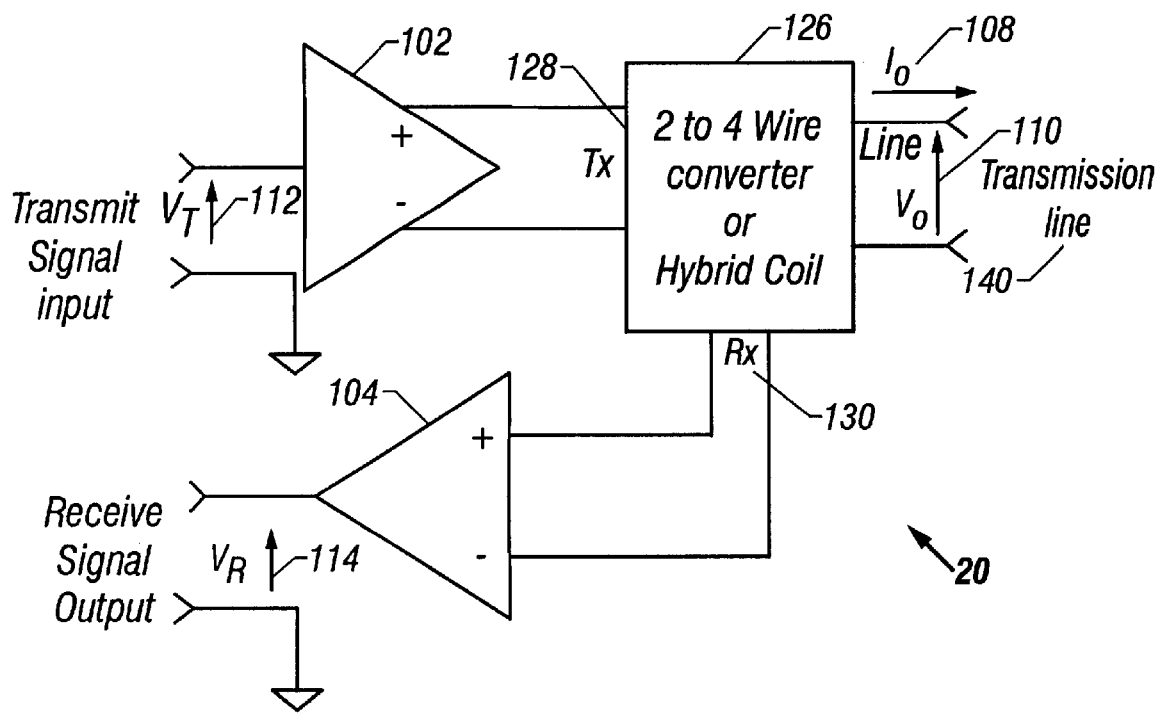
FIG. 1B shows a full duplex configuration of a transmitter/receiver circuit.

Turning now to FIG. 1B, FIG. 1B shows a full duplex configuration 12 of transmitter/receiver circuit connected to a transmission line 140. This configuration is also well known to skilled practitioners in the relevant art. In the half duplex configuration of FIG. 1B, a transmit input signal 112 is connected to an input of a differential transmitter 102. An output of the transmitter is connected to a transmission line signal 108, 110 through one port 128 of a hybrid coil or four-to-two wire converter 126. A receive output signal 114 is provided by an output of a differential receiver 104. An input of the receiver 104 is connected the transmission line signal 108, 110 through another port 130 of the hybrid coil or four-to-two wire converter 126. In this full duplex configuration 12, the transmission line 140 may transmit signals in both directions simultaneously, the directional coupling and line termination being performed by the hybrid coil or four-to-two wire converter 126.

The subsequent descriptions of embodiments of the present invention pertain to the transmitter 102 of FIG. 1A and FIG. 1B. Skilled practitioners will recognize that embodiments of the present invention may be used with a receiver 104 in either a half duplex configuration of FIG. 1A or the full duplex configuration of FIG. 1B, eliminating the need for the switch 106 or the hybrid coil or four-to-two wire converter.

Turning now to FIG. 2A and FIG. 2B, FIG. 2A shows a Thevenin equivalent circuit 20 of a voltage transmitter circuit and FIG. 2B shows an equivalent circuit 22 of the circuit 20 shown in FIG. 2A. In FIG. 2A, a voltage generator $V_g$ 202 represents a Thevenin equivalent open circuit voltage source and an impedance $Z_g$ 204 represents a Thevenin equivalent impedance. The circuit has an output voltage $V_o$ 208 and an output current $I_o$ 206 connected to a load impedance $Z_L$ 240. By measuring the output current $I_o$ 206 and negatively feeding it back with an appropriate gain required to synthesize the impedance $Z_g$ 204, the equivalent circuit 22 shown in FIG. 2B is formed. FIG. 2B comprises a voltage generator 222 having a value of $$V_o = V_g - Z_g I_o$$

that provides the output voltage $V_o$ 208 and the output current $I_o$ 206 connected to a load impedance $Z_L$ 240. Note that $V_o$ 208 and $I_o$ 206 are the same in FIG. 2A and FIG. 2B. If the value of $V_g$ is set to zero (short-circuit) and a current generator of unity value is connected to the outputs of the circuits shown in both FIG. 2A and FIG. 2B, the value of the voltage $V_o = Z_g$ is the sane in both circuits. This example illustrates the principle of operation of one of the embodiments of the present invention. That is, in a voltage transmitter circuit, the source impedance $Z_g$ 204 may be matched to a load impedance $Z_L$ 240 by measuring the output current from the circuit and negatively feeding back a scaled part of the output current determined by the value of the load impedance $Z_L$ 240. In this manner, maximum power transfer may be achieved by setting $Z_g$ 204=$Z_L$ 240 without power loss in $Z_g$ 204.

Turning now to FIG. 3A and FIG. 3B, FIG. 3A shows a Norton equivalent circuit 30 of a current transmitter circuit and FIG. 3B shows an equivalent circuit 32 of the circuit 30 shown in FIG. 3A. In FIG. 3A, a current generator $I_g$ 302 represents a Norton equivalent short circuit current source and an impedance $Z_g$ 304 represents a Norton equivalent impedance. The circuit has an output voltage $V_o$ 308 and an output current $I_o$ 306 connected to a load impedance $Z_L$ 340. By measuring the output voltage $V_o$ 306 and negatively feeding it back with an appropriate gain required to synthesize the admittance $1/Z_g$ 304, the equivalent circuit 32 shown in FIG. 3B is formed. FIG. 3B comprises a current generator 322 having a value of $$I_o = I_g - V_o/Z_g$$

that provides the output voltage $V_o$ 308 and the output current $I_o$ 306 connected to the load impedance $Z_L$ 340. Note that $V_o$ 308 and $I_o$ 306 are the same in FIG. 3A and FIG. 3B. If the value of $I_g$ is set to zero (open-circuit) and a voltage generator of unity value is connected to the outputs of the circuits shown in both FIG. 3A and FIG. 3B, the value of the current $I_o=1/Z_g$ is the same in both circuits. This example illustrates the principle of operation of one of the embodiments of the present invention. That is, in a current transmitter circuit, the source impedances $Z_g$ 304 may be matched to a load impedance $Z_L$ 340 by measuring the output voltage from the circuit and negatively feeding back a scaled part of the output voltage, determined by the value of the load admittances $1/Z_L$ 340. In this manner, maximum power transfer may be achieved by setting $Z_g$ 304=$Z_L$ 340 without power loss in $Z_g$ 304.

Figure 4:
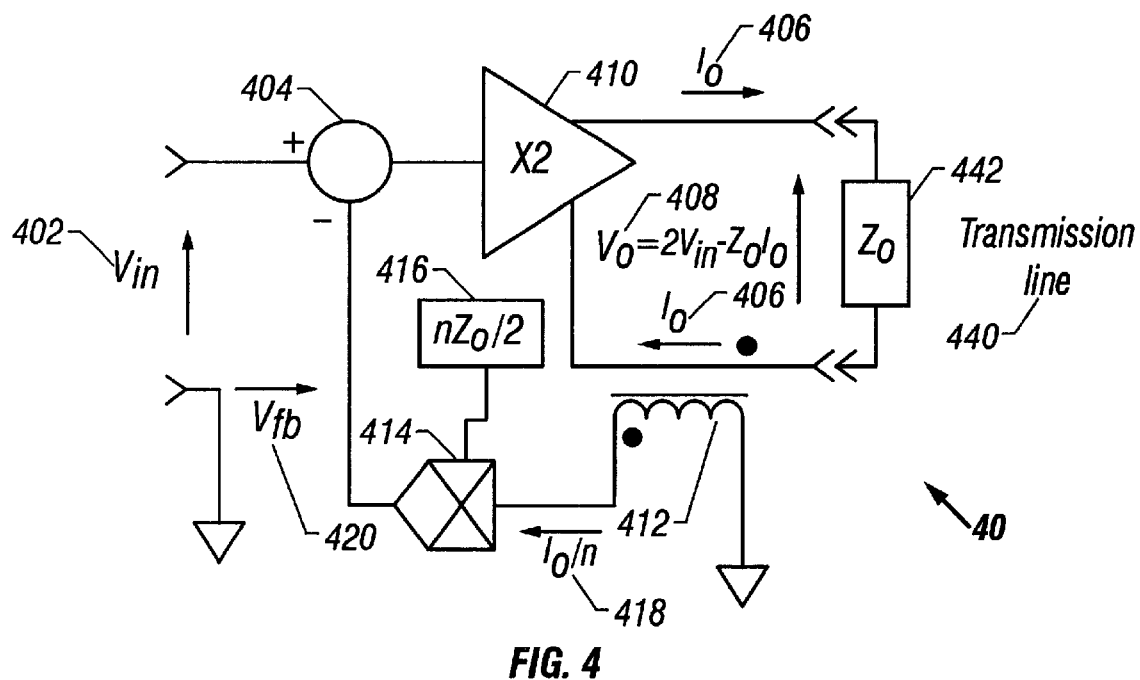
FIG. 4 shows a block diagram of a voltage transmitter circuit.

Turning now to FIG. 4, FIG. 4 shows a block diagram of a voltage transmitter circuit 40 connected to a transmission line 440 having a characteristic impedance $Z_o$ 442. The block diagram 40 illustrates a use of current feedback 418 from the an output of a voltage driver 410 to synthesize a driver circuit whose Thevenin equivalent is a voltage generator of amplitude $2V_{in}$ in series with an impedance $Z_o$, similar to the circuit shown in FIG. 2A. The input voltage $V_{in}$ 402 is summed with a negative feedback voltage $V_{fb}$ 420 to provide an input voltage of $V_{in}-V_{fb}$ to the voltage driver 410. Since the voltage driver 410 has a voltage gain of two, the output voltage $V_o$ 408 of the voltage driver 410 is $V_o=2V_{in}-2V_{fb}$. A transformer 412 having a turns ratio of n senses the output current $I_o$ 406 and provides the signal $I_o/n$ to one input to a multiplier 414. Another input signal to the multiplier is the constant value $nZ_o/2$ 516. Therefore, the output signal of the multiplier 414 is $V_{fb}=(I_o/n)(nZ_o/2)=I_oZ_o/2$ 420. By substituting this value of $V_{fb}$ 420 into the expression above for the output voltage $V_o$ 408, the output voltage $$V_o = 2V_{in} - I_o Z_o$$

This expression for the output voltage $V_o$ 408 has the form of the output voltage of FIG. 2A and FIG. 2B, and illustrates how the driving source impedance may be matched to the characteristic impedance of a transmission without the use of power consuming components. Summarizing, the output current 406 is measured, scaled and multiplied by an impedance $nZ_o/2$, resulting in the feedback voltage $V_{fb}$ 420. The feedback voltage $V_{fb}$ 420 is subtracted from the input voltage $V_{in}$ 402 and fed to an input of the voltage driver 410, which has a gain of two. The scaling and multiplication may be accomplished on a current-to-voltage converter, the output driver, or through use of digital filtering techniques in a Digital Signal Processor (DSP). Note that the voltage driver 410 will only generate the voltage seen by the line $V_o$, even if the Thevenin equivalent circuit has a voltage generator of twice this value. This method achieves the objective of impedance matching without wasting power or dropping a voltage in an impedance-matching resistor. This method is also adaptable to the use of a DSP to enable more accurate and adaptive matching through digital signal processing techniques. It also allows full duplex communication over the same transmission line.

Figure 5:
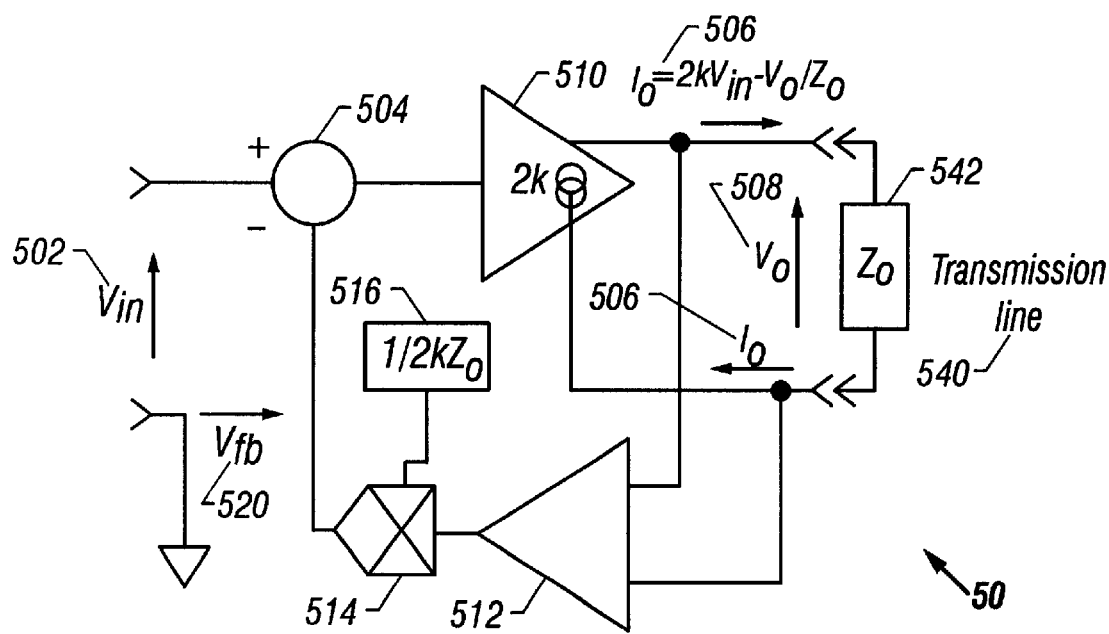
FIG. 5 shows a block diagram of a current transmitter circuit.

Turning now to FIG. 5, FIG. 5 shows a block diagram of a current transmitter circuit 50 connected to a transmission line 540 having a characteristic impedance $Z_o$ 542. The block diagram 50 illustrates a use of output voltage feedback $V_o$ 508 from an output of a transconductance driver 510 to synthesize a driver circuit 50 whose Norton equivalent circuit is a current generator of amplitude $I_o=kV_{in}$ 506 having an internal shunt impedance $Z_g=Z_o$, the characteristic impedance of the line, and a transconductance of k, similar to FIG. 3A. The input voltage $V_{in}$ 502 is summed with a negative feedback voltage $V_{fb}$ 520 to provide an input voltage of $V_{in}-V_{fb}$ to the transconductance driver 510. Since the transconductance driver 510 has a transconductance of $2k$, the output current $I_o$ 506 of the transconductance driver 510 is $I_o=2kV_{in}-2kV_{fb}$. An amplifier 512 senses the output voltage $V_o$ 508 and provides this signal $V_o$ 508 to one input of a multiplier 514. Another input signal to the multiplier is the constant value $1/2kZ_o$ 516. Therefore, the output signal of the multiplier 514 is $V_{fb}=V_o/2kZ_o$ 520. By substituting this value of $V_{fb}$ 520 into the expression above for the output current $I_o$ 506, the output current $$I_o = 2kV_{in} - V_o/Z_o$$

This expression for the output current $I_o$ 506 has the form of the output current of FIG. 3A and FIG. 3B, and illustrates how the driving source impedance may be matched to the characteristic impedance of a transmission without the use of power consuming components. Summarizing, the output voltage 508 is measured and multiplied by an admittance $1/2kZ_o$, resulting in the feedback voltage $V_{fb}$ 520. The feedback voltage $V_{fb}$ 520 is subtracted from the input voltage $V_{in}$ 502 and fed to an input of the transconductance driver 510, which has a gain of 2k, where k is the transconductance of the transconductance driver 510. The scaling and multiplication may be accomplished on an amplifier, the output driver, or through use of digital filtering techniques in a Digital Signal Processor (DSP). This method achieves the objective of impedance matching without wasting power or dropping a voltage in an impedance-matching resistor. This method is also adaptable to the use of a DSP to enable more accurate and adaptive matching through digital signal processing techniques. It also allows full duplex communication over the same transmission line.

Figure 6A:
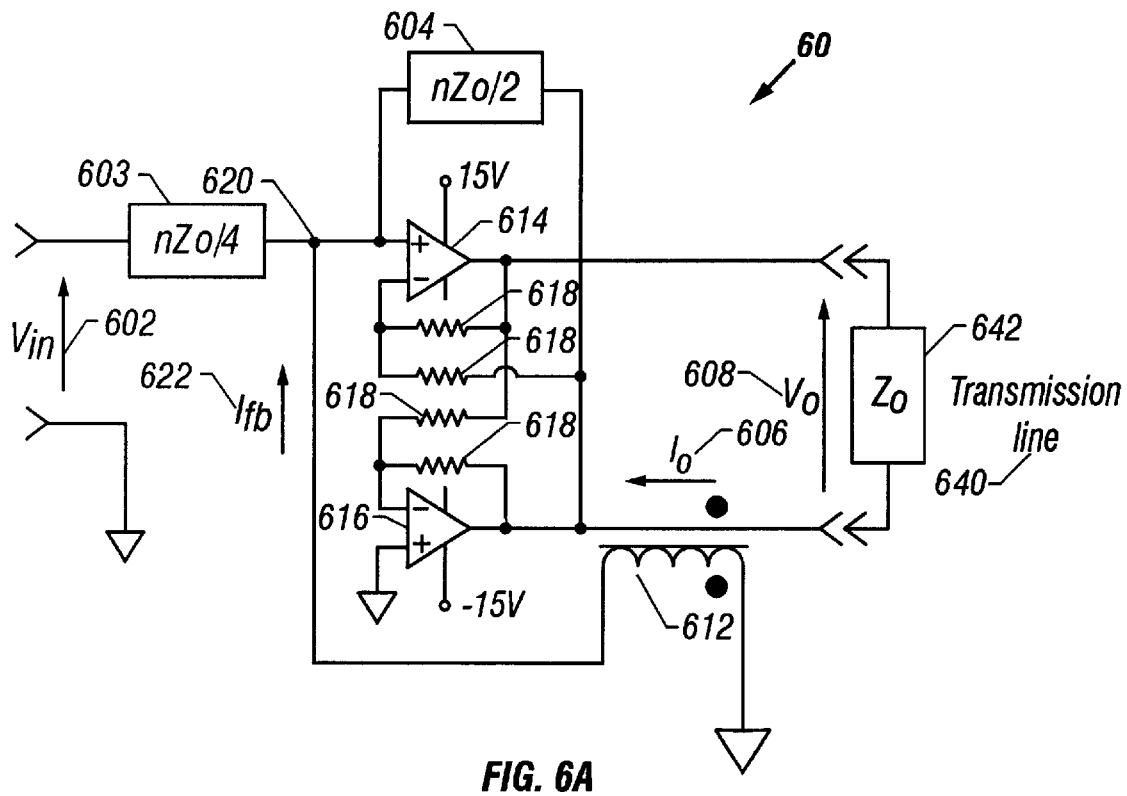
FIG. 6A shows a circuit diagram of an a voltage transmitter using an inductive sensor.

Turning now to FIG. 6A, FIG. 6A shows a circuit diagram 60 of a voltage transmitter circuit using an inductive sensor connected to a transmission line 640 having a characteristic impedance $Z_o$ 642. The voltage transmitter circuit of FIG. 6A comprises a first operational amplifier 614 and a second operational amplifier 616 having input and outputs connected to a resistor network 618. An input voltage $V_{in}$ 602 is connected to one terminal of an input impedance $nZ_o/4$ 603. Another terminal of the input impedance $nZ_o/4$ 603 connects a summing junction 620. An output voltage $V_o$ 608 is derived between an output terminal of the first amplifier 614 and an output terminal of the second amplifier 616. The voltages at the output terminals of the amplifiers are mirror images of each other. That is, when the output terminal of the first amplifier is at given voltage, the output terminal of the second amplifier is at an equal voltage of opposite polarity. The magnitude of the voltage at the output terminal of each amplifier 614, 616 is $V_o/2$. A terminal of a feedback impedance $nZ_o/2$ 604 is connected to the output terminal of the second amplifier 616 and another terminal of the feedback impedance $nZ_o/2$ 604 is connected to the summing junction 620. A transformer 612 senses the output current $I_o$ 606 and provides a scaled feedback current $I_{fb}=I_o/n$ 622 to the summing junction 620. By summing the currents into the summing junction, an expression for the output voltage may be derived $$V_o = 4V_{in} - I_o Z_o$$

This expression for the output voltage $V_o$ 608 has the form of the output voltage of FIG. 2A and FIG. 2B, and illustrates how the driving source impedance may be matched to the characteristic impedance of a transmission without the use of power consuming components.

Figure 6B:
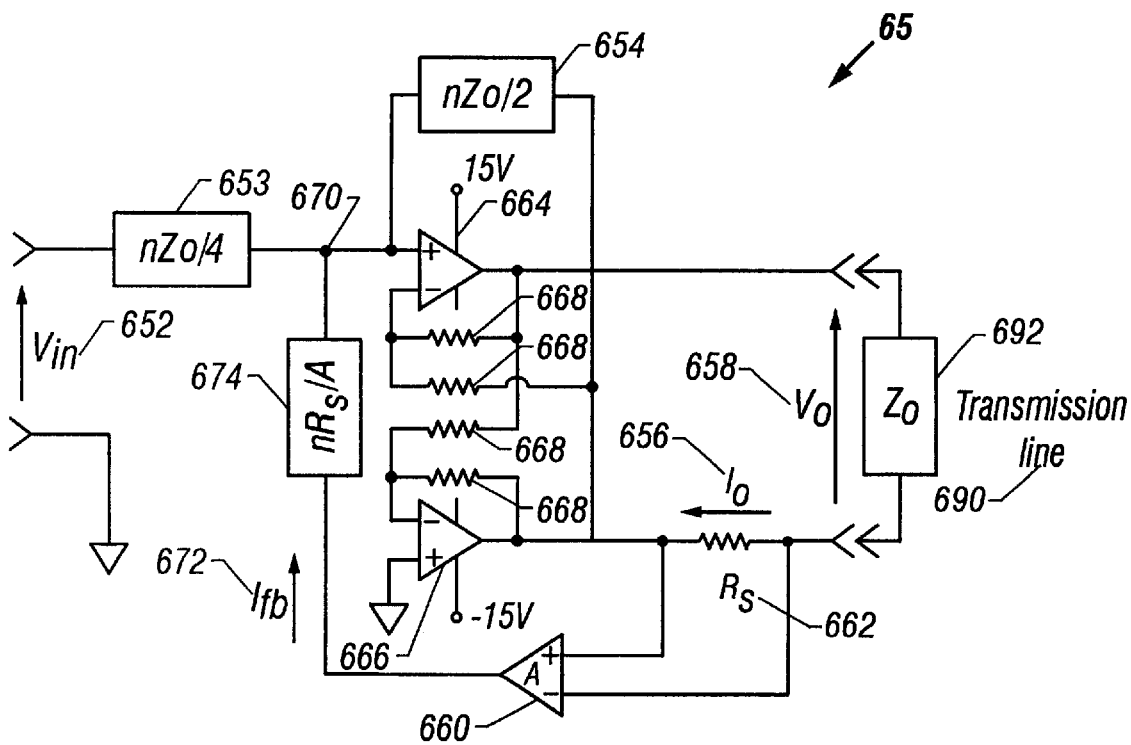
FIG. 6B shows a circuit diagram of a voltage transmitter using a resistive sensor.

Turning now to FIG. 6B, FIG. 6B shows a circuit diagram 65 of a voltage transmitter circuit using a resistive sensor connected to a transmission line 690 having a characteristic impedance $Z_o$ 692. FIG. 6B is similar to FIG. 6A, except that a current sensing resistor $R_s$ 662, a differential amplifier 660 with a gain of A and a resistor $nR_s/A$ 674 have replaced the current sensing transformer of FIG. 6A. The inputs of the amplifier 660 are connected to the terminals of the sensing resistor $R_s$ 662. The output current $I_o$ 656 through the sensing resistor $R_s$ 662 creates a voltage that is detected by the amplifier 660. The output of the amplifier 660 is connected to a terminal of the resistor $nR_s/A$ 674 and another terminal of the resistor $nR_s/A$ 674 is connected to a summing junction 670. The voltage transmitter circuit of FIG. 6B further comprises a first operational amplifier 664 and a second operational amplifier 666 having input and outputs connected to a resistor network 668. An input voltage $V_{in}$ 652 is connected to one terminal of an input impedance $nZ_o/4$ 653. Another terminal of the input impedance $nZ_o/4$ 653 connects the summing junction 670. An output voltage $V_o$ 658 is derived between an output terminal of the first amplifier 664 and an output terminal of the second amplifier 666. The voltages at the output terminals of the amplifiers are mirror images of each other. That is, when the output terminal of the first amplifier is at given voltage, the output terminal of the second amplifier is at an equal voltage of opposite polarity. The magnitude of the voltage at the output terminal of each amplifier 664, 666 is $V_o/2$. A terminal of a feedback impedance $nZ_o/2$ 654 is connected to the output terminal of the second amplifier 666 and another terminal of the feedback impedance $nZ_o/2$ 654 is connected to the summing junction 670. By summing the currents into the summing junction, an expression for the output voltage may be derived:

$$V_o = 4V_{in} - I_o Z_o$$

This expression for the output voltage $V_o$ 658 has the form of the output voltage of FIG. 2A and FIG. 2B, and illustrates how the driving source impedance may be matched to the characteristic impedance of a transmission without the use of power consuming components.

Figure 7:
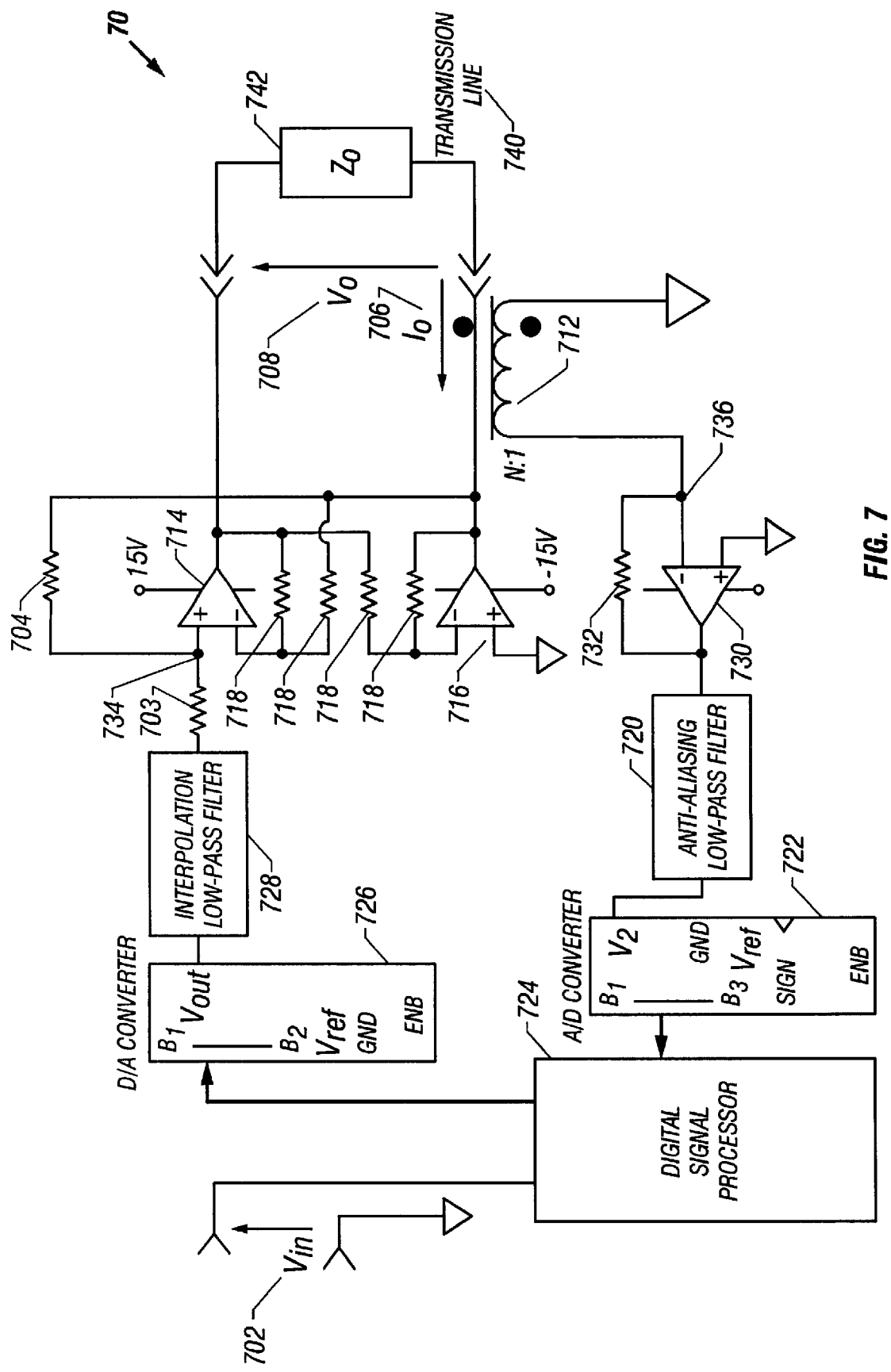
FIG. 7 shows a circuit diagram of a DSP implementation of a voltage transmitter.

Turning now to FIG. 7, FIG. 7 shows a circuit diagram 70 of a DSP implementation of a voltage transmitter connected to a transmission line 740 having a characteristic impedance $Z_o$ 742. The amplifiers 714, 716, resistor network 718, input resistor 703, feedback resistor 704, and transformer 712 are similar to those corresponding elements shown in FIG. 6A. The voltage transmitter circuit of FIG. 7 comprises a first operational amplifier 714 and a second operational amplifier 716 having input and outputs connected to a resistor network 718. An input resistor 703 connects between an output of an interpolation filter 728 and a summing junction 734. A feedback resistor 704 connects between the summing junction 734 and an output of the second amplifier. An output voltage $V_o$ 708 is derived between an output terminal of the first amplifier 714 and the output terminal of the second amplifier 716. The voltages at the output terminals of the amplifiers are mirror images of each other. That is, when the output terminal of the first amplifier is at given voltage, the output terminal of the second amplifier is at an equal voltage of opposite polarity. The magnitude of the voltage at the output terminal of each amplifier 714, 716 is $V_o/2$. A transformer 712 senses the output current $I_o$ 706 and provides a scaled feedback current $I_o/n$ to the summing junction 736 of an I/V converter 730. A feedback resistor 732 connects between an output of the I/V converter 730 and the summing junction 736 of the I/V converter 730. The output of the I/V converter 730 is connected to the input of an anti-aliasing filter 720. An output of the anti-aliasing filter 720 is connected to an input of an analog-to-digital (A/D) converter 722. Outputs from the A/D converter 722 are connected to a DSP 724. Outputs from the DSP 724 are connected to the inputs of a digital-to-analog (D/A) converter 726. An output from the D/A converter 726 is connected to the interpolation filter 728. Normally the DSP generates the signals to be transmitted over the transmission line, functioning as a modem. Alternatively, a digital input voltage $V_{in}$ 702 is connected an input terminal of the DSP. By performing scaling and feedback functions in a DSP 724, intelligence is added to the process that allows sophisticated and adaptive matching of the characteristic impedance $Z_o$ of the transmission line. The DSP 724 may send a voltage signal $V_o$ to the line, measure the resulting current and calculate a transfer function, such as nV/I. With sufficient over-sampling to avoid excessive phase shift, the line impedance may be matched by multiplying the line current $I_o$ by a suitable transfer function and subtracting the result from twice the intended output signal $V_o$. For full duplex operation, the received signal may be obtained by digitally subtracting the transmitted signal from the line voltage $V_o$ measured by a receiver. Since the invention requires the use of line impedance models, with a DSP, these models are no longer limited to simple passive network elements.

Figure 8A:
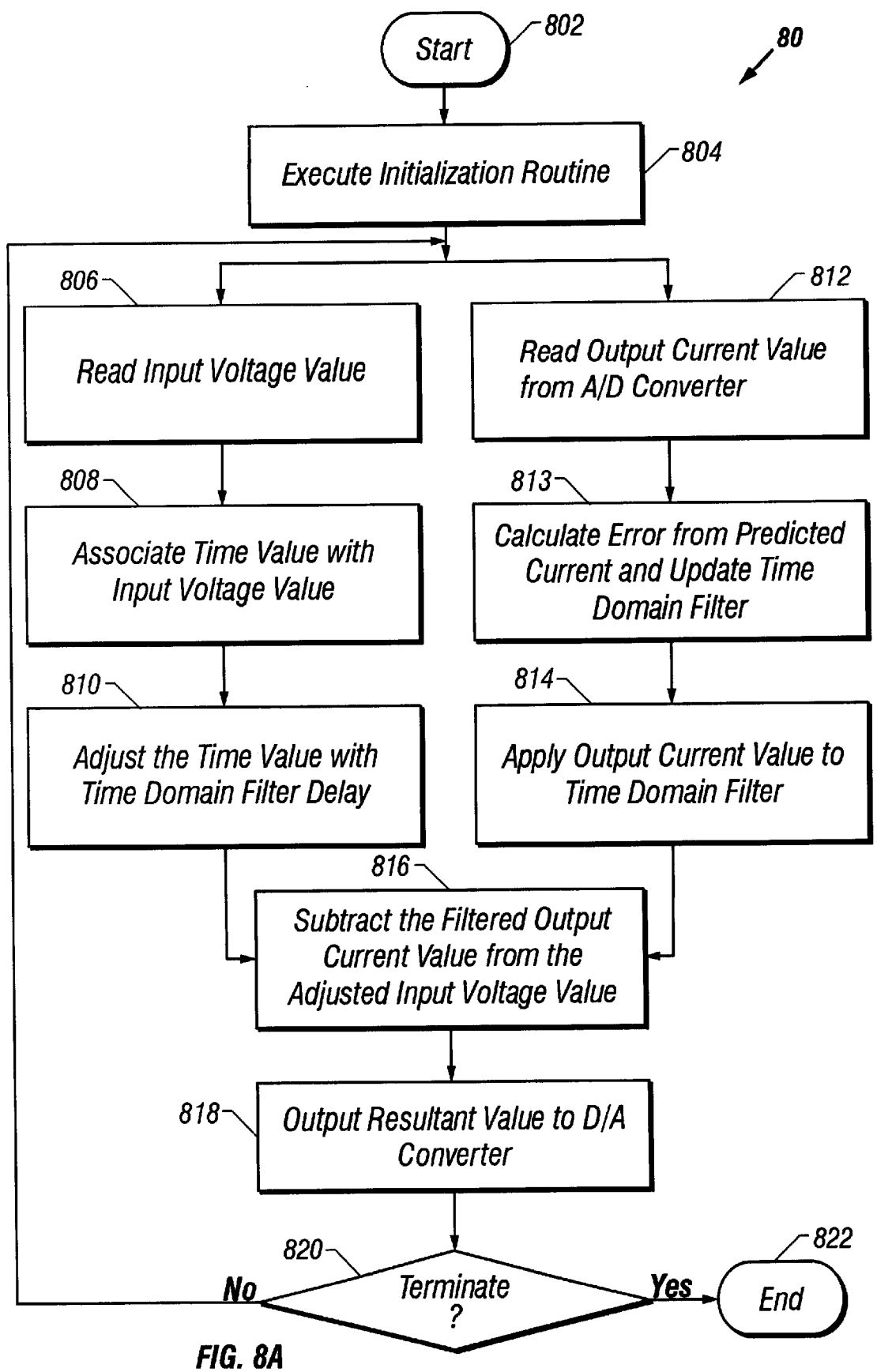
FIG. 8A shows a flow diagram of a program executed in the DSP of FIG. 7.

Turning now to FIG. 8A, FIG. 8A shows a representative flow diagram 80 of a program executed in the DSP of FIG. 7. The DSP is started 802 whenever it is initially powered on or reset. A first step is an execution of an initialization routine 804. The details of the initialization routine 804 are described in the description of FIG. 8B. The DSP then reads a value representing an input voltage 806, associates a current time value with the input voltage 808, and adjusts the time value for a time domain filter delay 810. Concurrently with these steps, the DSP reads a value representing an output current $I_o/n$ from an A/D converter 812, calculates an error from a predicted current and updates time domain filter 813, and applies the output current value to a $nZ_o/2$ time domain filter 814. The DSP then subtracts the filtered output current value from the input voltage value 816, and provides the resultant value to a D/A converter. If the DSP operation is to be terminated 820, the process is ended 822. If not terminated 820, the process beginning with concurrently reading input voltage values 806 and reading output current values 812 is repeated. As an alternative to the initialization routine 804 described in FIG. 8B, the initialization routine may be limited to setting initial parameters of the time domain filter for synthesizing an output impedance of approximate value. Then, referring to FIG. 8A, the DSP would read the output current 812, calculate an error from a predicted current and update the time domain filter 813 with a fraction of the error to improve the matching in a recursive manner. These updated values would then be used to adjust the output voltage 816.

Figure 8B:
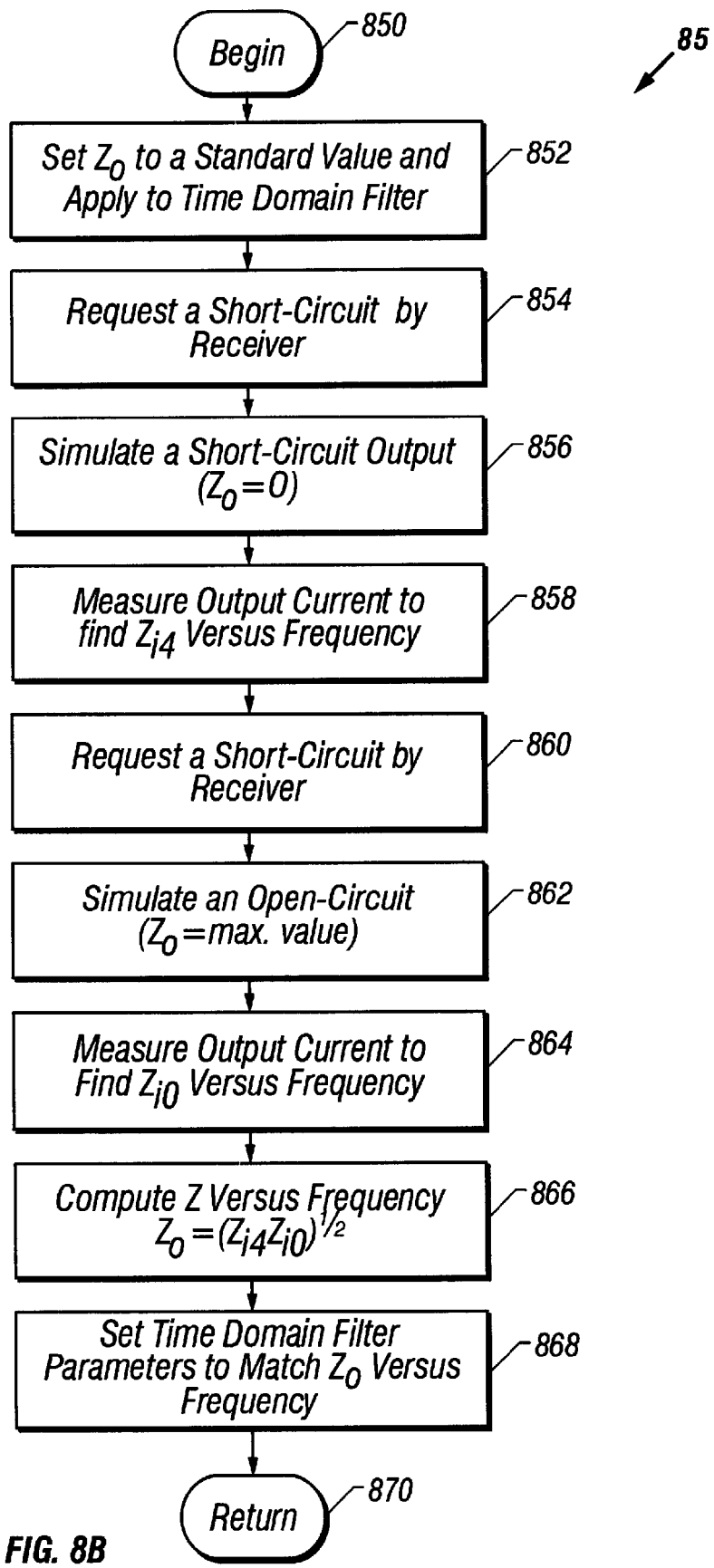
FIG. 8B shows a flow diagram of an initialization routine.

Turning now to FIG. 8B, FIG. 8B shows a flow diagram 85 of an initialization routine depicted as step 804 in FIG. 8A. If the DSP requires initialization, as described in the description of FIG. 8A, the initialization routine is started 850. A value of the characteristic impedance $Z_o$ of the transmission line is set to approximately match the transmission line and this value is applied to a time domain filter 852. For example, an approximate value of 600 ohms is used for telephone lines, 120 ohms for twisted pair, or 50 ohm for coaxial cable. The DSP then initiates a request to a receiver at the opposite end of the transmission line to present a short-circuit for a fixed amount of time 854, simulates a short-circuit output by setting an output voltage to a constant 856, and measures the value of an output current to find values for a short-circuit impedance $Z_{is}$ versus frequency 858. The DSP then initiates a request to the receiver at the opposite end of the transmission line to present an open-circuit for a fixed amount of time 860, simulates an open-circuit output by setting an output voltage to zero and setting $Z_o$ to a high value 862, and measures the value of the output current to find values for an open circuit impedance $Z_{io}$ versus frequency 864. The DSP then computes values for the characteristic impedance $Z_o = (Z_{is}Z_{os})^{1/2}$ versus frequency 866 and sets time domain filter parameters to match $Z_o$ versus frequency 869. Control is then returned to the main program 870.

Although the present invention has been described in detail with reference to certain preferred embodiments, it should be apparent that modifications and adaptations to those embodiments may occur to persons skilled in the art without departing from the spirit and scope of the present invention as set forth in the following claims.

What is claimed is:

1. A device for active impedance matching, comprising:
   a. a voltage driver having an output connected to a load;
   b. means for detecting an output current from the voltage driver to the load;
   c. means for scaling the detected output current by a scaling value; and
   d. means for subtracting a value representing the scaled detected output current from an input signal of the voltage driver.

2. The device of claim 1, wherein the means for scaling the detected output current is a multiplier having an input comprising the detected output current and another input comprising the scaling value, an output of the multiplier representing the scaled output current.

3. The device of claim 2, wherein the scaling value is a value representing a load impedance to be matched.

4. The device of claim 1, wherein the means for detecting an output current is a transformer having a primary winding in series with the output current.

5. The device of claim 1, wherein the means for subtracting is a summing junction of an operational amplifier.

6. The device of claim 1, wherein the load is a transmission line.

7. The device of claim 6, wherein the scaling value is a characteristic impedance of the transmission line.

8. A method for active impedance matching, comprising:
   a. connecting an output of a voltage driver to a load;
   b. detecting an output current from the voltage driver to the load;
   c. scaling the detected output current by a scaling value; and
   d. subtracting a value representing the scaled detected output current from an input signal of the voltage driver.

9. The method of claim 8, wherein scaling the detected output current comprises multiplying the detected output current by the scaling value, an output of the multiplication representing the scaled output current.

10. The method of claim 9, wherein the scaling value is a value representing a load impedance to be matched.

11. The method of claim 8, wherein scaling the detected output current comprises amplifying the detected output current by the scaling value for obtaining a value representing the scaled output current.

12. The method of claim 8, wherein detecting an output current comprises connecting a primary winding of a transformer in series with the output current.

13. The method of claim 8, wherein detecting an output current comprises connecting a resistor in series with the output current and connecting inputs of a differential amplifier to terminals of the resistor.

14. The method of claim 8, wherein subtracting comprises summing currents into a summing junction of an operational amplifier.

15. The method of claim 8, wherein the load is a transmission line.

16. The method of claim 15, wherein the scaling value is a characteristic impedance of the transmission line.

* * * * *